United States Patent
Tanase

(10) Patent No.: US 9,608,626 B1
(45) Date of Patent: Mar. 28, 2017

(54) INTEGRATED CIRCUIT WITH PRECISION CURRENT SOURCE

(71) Applicant: Maxim Integrated Products, Inc., San Jose, CA (US)

(72) Inventor: Gabriel E. Tanase, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/862,744

(22) Filed: Sep. 23, 2015

Related U.S. Application Data

(60) Division of application No. 14/170,557, filed on Jan. 31, 2014, now Pat. No. 9,148,140, which is a continuation-in-part of application No. 13/629,491, filed on Sep. 27, 2012, now Pat. No. 8,742,800.

(51) Int. Cl.
| | |
|---|---|
| *H03K 17/687* | (2006.01) |
| *H01L 27/06* | (2006.01) |
| *H01L 27/092* | (2006.01) |
| *H01L 27/02* | (2006.01) |
| *H05B 33/08* | (2006.01) |

(52) U.S. Cl.
CPC ..... *H03K 17/6871* (2013.01); *H01L 27/0207* (2013.01); *H01L 27/0629* (2013.01); *H01L 27/092* (2013.01); *H05B 33/0809* (2013.01)

(58) Field of Classification Search
CPC ............ H03K 17/6871; H05B 33/0812; H05B 33/0809; H01L 27/0207; H01L 27/0629; H01L 27/092
See application file for complete search history.

(56) References Cited

U.S. PATENT DOCUMENTS

| | | |
|---|---|---|
| 5,796,278 A | 8/1998 | Osborn et al. |
| 5,856,749 A | 1/1999 | Wu |
| 6,002,276 A | 12/1999 | Wu |
| 6,028,640 A | 2/2000 | Nayebi et al. |
| 7,053,694 B2 | 5/2006 | Ozawa |
| 7,071,767 B2 | 7/2006 | Ou-yang et al. |
| 7,385,377 B2 | 6/2008 | Pisasale et al. |
| 7,471,152 B2 | 12/2008 | Jiang et al. |
| 7,482,798 B2 | 1/2009 | Han |
| 8,294,449 B2 | 10/2012 | Ide |
| 8,514,023 B2 * | 8/2013 | Leong ..................... G05F 3/262 323/315 |
| 8,648,648 B2 | 2/2014 | Choi |
| 2001/0035789 A1 | 11/2001 | Tsuchiya |

OTHER PUBLICATIONS

Ball, Alan, Technical Brochure, "AND8140/D Current Limit Function", ON Semiconductor, Aug. 2011, Rev. 3, pp. 1-6.

* cited by examiner

*Primary Examiner* — Jung Kim
(74) *Attorney, Agent, or Firm* — TIPS Group

(57) ABSTRACT

An integrated circuit with precision current source includes a first MOSFET, a second MOSFET, an op-amp and a resistor formed on a common semiconductor substrate. The first MOSFET is characterized by a first multiplier (×M1) and the second MOSFET is characterized by a second multiplier (×M2) where a ratio of ×M2 to ×M1 is greater than one. An inverting input of the op-amp is coupled to a drain of the first MOSFET and an output of the op-amp is coupled to a gate of the first MOSFET. A negative feedback circuit limits a rise in output current under low output voltage conditions.

20 Claims, 3 Drawing Sheets

INTEGRATED CIRCUIT WITH PRECISION CURRENT SOURCE

CROSS REFERENCE TO RELATED APPLICATION

This application is a division of U.S. Ser. No. 14/170,557, filed Jan 31, 2014, now U.S. Pat. No. 9,148,140, which is a continuation-in-part of U.S. Ser. No. 13/629,491, filed Sep. 27, 2012, now U.S. Pat. No. 8,742,800, both of which are incorporated herein by reference.

BACKGROUND

High-current precision current sources are useful for such applications as light emitting diode (LED) drivers. This is because LEDs tend to draw relatively high levels of current, e.g. in the 1+ amperes range, and operate best with a precise, constant and steady current supply.

FIG. 1 is a block diagram of a prior art integrated circuit (IC) 10 including low-side current control circuitry 12 for an LED 14. IC 10 also includes a PMOS transistor 16 and a sensing resistor (RS) 18 which couples a cathode of LED 14 to ground. In operation, the control circuitry 12 senses the voltage drop across sensing resistor 18 and provides a control signal on the gate of PMOS transistor 16 to regulate the flow of current through the LED 14.

FIG. 2 is a block diagram of a prior art integrated circuit 20 including low-side current control circuitry 22 and an NMOS transistor 24. The control circuitry 22 senses the voltage across a sensing resistor (RS) 26. An LED 28 is coupled between the sensing resistor 26 and the drain of NMOS transistor 24. The control circuitry 12 regulates the flow of current through LED 24 by applying a control signal to the gate of NMOS transistor 24.

A disadvantage of the circuits of FIGS. 1 and 2 is that the high currents that drive the LEDS flow through the sensing resistors RS. Since the power consumed by a resistor is $I^2R$ it is therefore desirable to make the sensing resistors RS as low in resistance as possible, e.g. less than about $1\Omega$. Because of the low resistance of the sensing resistors they typically are precision resistors which are expensive and hard to provide on an integrated circuit. Furthermore, even though their resistances are very low, high currents flowing through sensing resistors RS result in a significant voltage drop. For example, if 1 ampere is flowing through a 1 ohm sensing resistor, the voltage drop across the resistor will be 1 volt. This voltage drop across the sensing resistor, referred to herein as "drop-out", reduces the potential voltage swing across the LEDs being driven by the circuits.

These and other limitations of the prior art will become apparent to those of skill in the art upon a reading of the following descriptions and a study of the several figures of the drawing.

SUMMARY

In an embodiment, set forth by way of example and not limitation, an integrated circuit with precision current source includes a first MOSFET, a second MOSFET, an op-amp, a resistor and a negative feedback circuit formed on a common semiconductor substrate. In this example, the first MOSFET is characterized by a first multiplier ×M1 and the second MOSFET is characterized by a second multiplier ×M2 where a ratio of ×M2 to ×M1 is greater than one. An inverting input of the op-amp is coupled to a drain of the first MOSFET and an output of the op-amp is coupled to a gate of the first MOSFET. The negative feedback serves to limit an output current flowing through the second MOSFET.

In a further example embodiment, the first MOSFET and the second MOSFET are both n-channel metal-oxide semiconductor (NMOS) transistors and wherein the first drain and the second drain are electrically connected to an output node and the second source is electrically connected to ground. In this example, the first MOSFET has a first gate-to-source voltage Vgs1 and the second MOSFET has a second gate-to-source voltage Vgs2, where Vgs1≈Vgs2.

In an embodiment, set forth by way of example and not limitation, a method for providing high current with low dropout includes: a) splitting an output current at a current output node into a first current which flows through a series connection of a first MOSFET and a sensing resistor to ground and a second current which flows through a second MOSFET to ground, where the second current is greater than the first current; b) maintaining a first gate-to-source voltage at the first MOSFET which is substantially equal to a second gate-to-source voltage at the second MOSFET; and c) using negative feedback to limit a current flowing through the second MOSFET. In a further example embodiment, maintaining the same gate-to-source voltages includes providing feedback of a voltage drop across the sensing resistor coupled to the first MOSFET.

An advantage of certain example embodiments is that the need for an external current sense resistor is not required. This is particularly advantageous in situations where the IC power supply is lower than the power supply for the load (e.g. an LED).

Another advantage is that a sensing resistor is not in the path of the majority of the current flow through the load. This reduces drop-out and also reduces $I^2R$ power losses through the sensing resistor.

Yet another advantage is that an efficient, precision, low-dropout, high-current, high-impedance current source is provided to drive load such as LEDs where the load voltage can be higher than the power supply voltage.

A still further advantage is that the rise in the output current is limited under low output voltage conditions.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
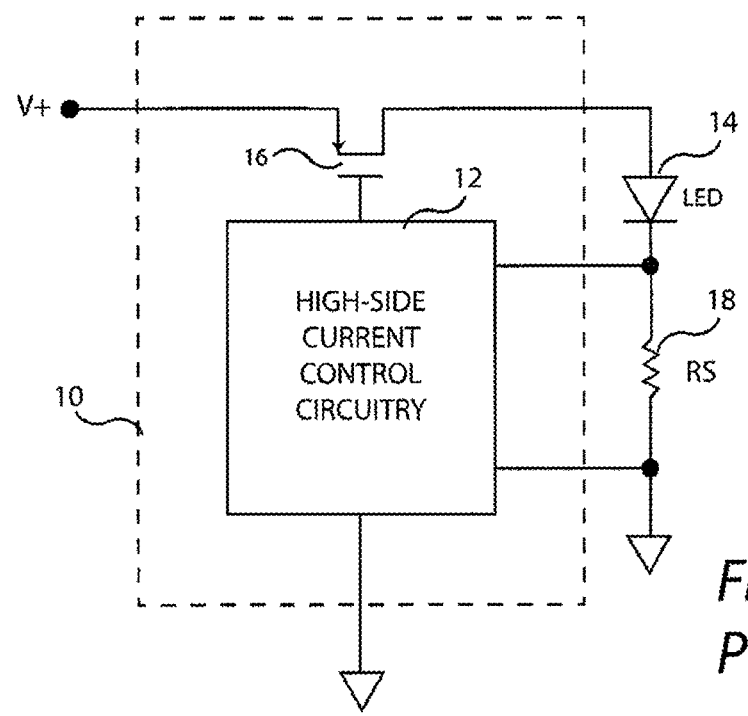
FIG. 1 is a block diagram of a prior art integrated circuit including high-side current control circuitry for an LED.
Figure 2:
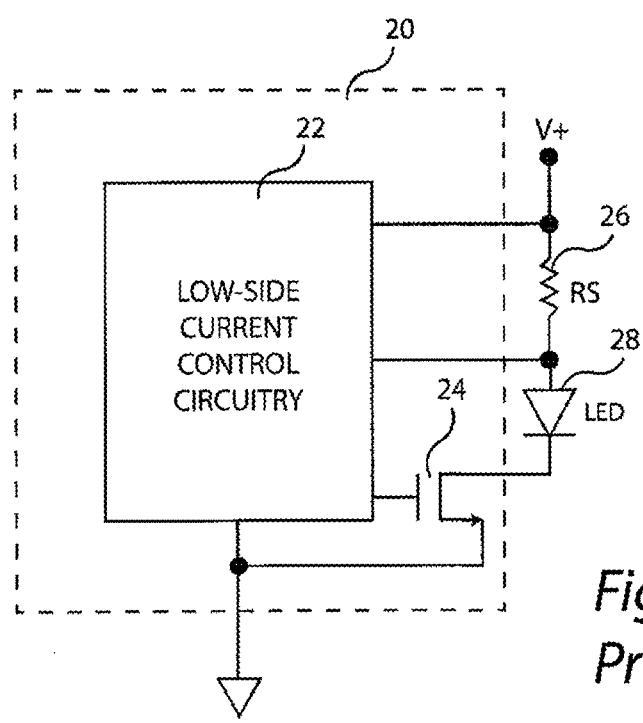
FIG. 2 is a block diagram of a prior art integrated circuit including low-side current control circuitry for an LED.
Figure 3:
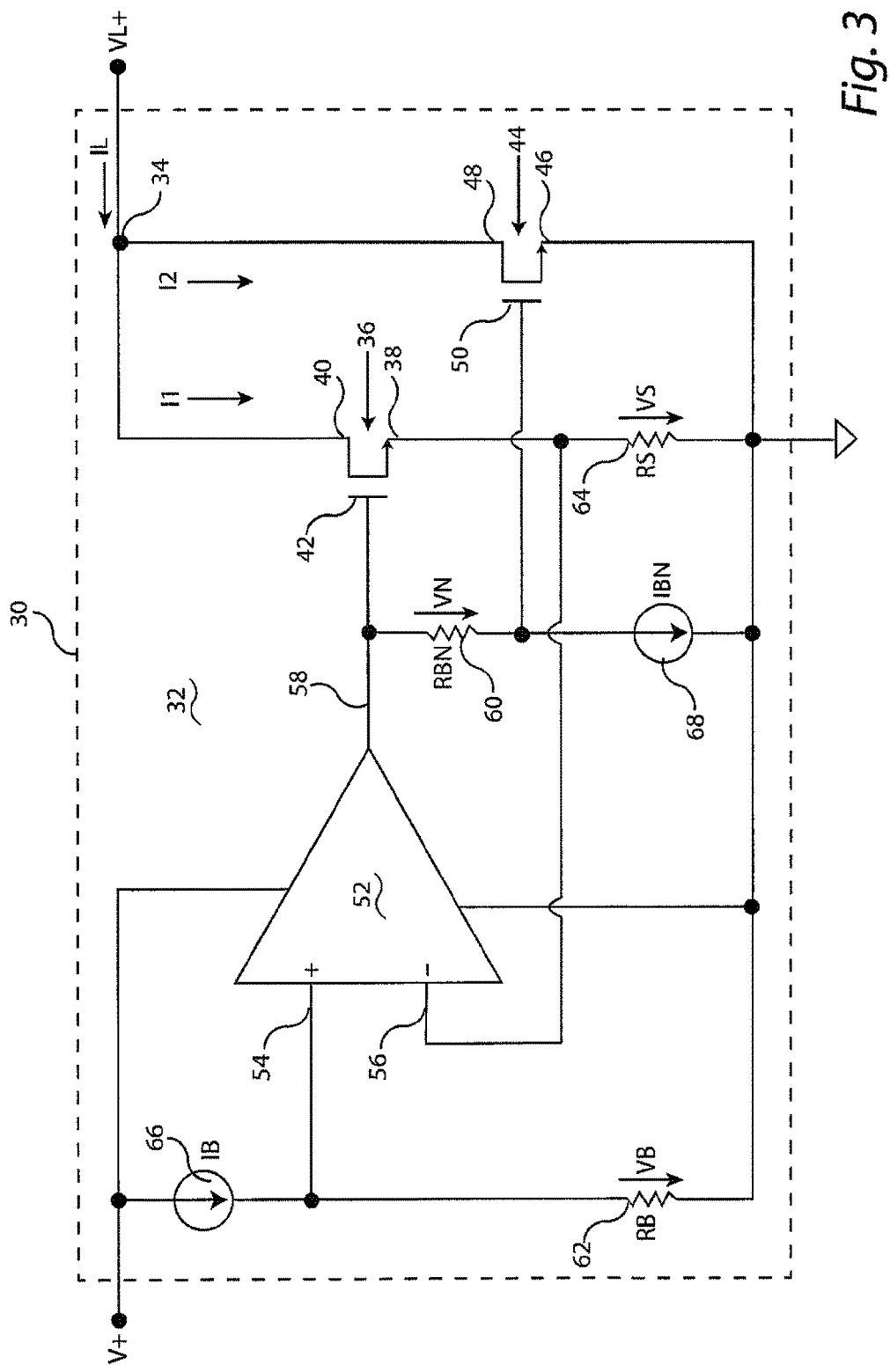
FIG. 3 is a schematic diagram of a first example integrated circuit with precision current source.

FIGS. 1 and 2 were described with reference to the prior art. In FIG. 3, an integrated circuit 30 includes a first embodiment, set forth by way of example and not limitation, of a current source circuit which provides a precision output or load current IL at a voltage VL+ at an output node 34. The output node 34 can provide high, precision current levels to loads such as light emitting diodes (LEDs). It should also be noted that the load voltage VL+ can be higher than the power source voltage V+.

As will be appreciated by those of skill in the art, an integrated circuit (IC) 30 includes a semiconductor substrate or "chip" 32 which has been processed to form circuitry including active and/or passive devices and interconnects therebetween. The chip is typically enclosed in an insulating package and is provided with leads, pads or pins that extend through the package to provide externally accessible connections to the circuitry of the chip. Advantageously, it is possible to accurately define the properties of components if IC's, such as transistors and resistors, due to the common substrate and common processing of those components during the manufacturing process.

In this non-limiting example, integrated circuit 30 includes a metal-oxide semiconductor field-effect transistor (MOSFET) 36 formed on semiconductor substrate 32 having a source 38, a drain 40 and a gate 42. MOSFET 36, in this example, is characterized by a multiplier ×M1. Integrated circuit 30 also includes a MOSFET 44 formed on semiconductor substrate 32 having a source 46, a drain 48 and a gate 50 and is characterized by a multiplier ×M2. In this example, the ratio of ×M2 to ×M1 is preferably greater than one, e.g. ×M2/×M1>1.

An operational amplifier (op-amp) 52, in this example, is also formed on semiconductor substrate 32. Op-amp 52 has a plus input 54, a minus input 56 and an output 58. The output 58 of op-amp 52 is connected to gate 42 of MOSFET 36. A resistor (RBN) 60 couples the gate 42 of MOSFET 36 to the gate 50 of MOSFET 44.

As will be appreciated by those of skill in the art, a MOSFET which is implemented on a semiconductor substrate can be characterized, at least in part, by its width and its length, other factors being the same. In this example, MOSFET 36 is characterized by a width W1 and a length L1, and MOSFET 44 is characterized by a width W2 and a length L2. In an embodiment, the lengths of MOSFET 36 and MOSFET 44 are approximately the same, e.g. L1 is approximately equal to L2. As used herein, "approximately the same" or "approximately equal" means that the characteristics being compared are within an acceptable range of being equal, where the acceptable range is dependent upon the required performance of the circuit. For example, "approximately the same", "approximately equal" and the like can mean within a few percentage points or less of being equal.

In embodiments where L1 of MOSFET 36 is approximately equal to L2 of MOSFET 44, W2 of MOSFET 44 can be designed to be greater than W1 of MOSFET 36, e.g. W2>W1. These differences in widths are directly related to the differences in multipliers between MOSFET 36 and MOSFET 44. That is, the ratio of currents through MOSFET 36 and MOSFET 44 can be expressed as: W1/L1≈W2/L2.

In this non-limiting example, both of MOSFET 36 and MOSFET 44 are n-channel metal-oxide semiconductor (NMOS) transistors. The drain 40 of MOSFET 36 and the drain 48 of MOSFET 44 are connected to output node 34. Furthermore, source 46 is connected to ground. It should be noted that NMOS transistors are used herein by way of example, and other components, such as PMOS transistors may be used with appropriate modifications to the circuitry.

It should also be noted that, as used herein, the term "connected" generally means that two nodes are electrically connected together by a conductive path, such as a conductive trace or channel. The term "coupled" includes connected but also includes an electrical path through one or more intermediate components.

Integrated circuit 30 further includes a resistor (RB) 62 coupling the plus input 54 of op-amp 52 to ground and a resistor (RS) 64 coupling source 38 to ground. It should be noted that resistors, such as resistors 60, 62 and 54, formed on semiconductor substrates, such as semiconductor substrate 32, can be quite precise and are easily matched, if desired.

In an embodiment, source 38 is coupled to the minus input 56 of the op-amp 52 to provide negative feedback. This has several desirable effects, including making the voltages between the positive input 54 and the negative input 56 of op-amp 52 substantially equal, except for a small offset error, as is well known to those of skill in the art. For example, a 0.5 mV offset between plus input 54 and minus input 56 can result in a small error in the order of 1%. It will be further appreciated by those of skill in the art that op-amp 52, when configured as shown and described, has high output 58 impedance. Furthermore, the negative feedback configured op-amp 52 provides for a desired biasing of MOSFETs 36 and 44.

Integrated circuit 30 also includes a current source (IB) 66 coupling a voltage source V+ to the plus input 54 of op-amp 52 and a current source (IBN) 68 coupling gate 50 of MOSFET 44 to ground. Current source 66 sets the voltage drop across bias resistor 62 and current source 68 sets the voltage drop VN across the NMOS bias resistor 60. The design and manufacture of IC current sources, such as current sources 66 and 68, are well known to those of skill in the art.

In this example embodiment, the circuit is designed such that the gate-to-source voltages of MOSFETS 36 and 44 are about the same. That is, if MOSFET 36 has a gate-to-source voltage of Vgs1 and if MOSFET 44 has a gate-to-source voltage of Vgs2, then Vgs1 is approximately equal to Vgs2. This can be accomplished using the negative feed-back op-amp 52 and current sources 66 and 68 to maintain the voltage drops across resistors 60, 62 and 64 to be about equal. That is, if the voltage drop across resistor 60 is VN, the voltage drop across resistor 62 is VB, and the voltage drop across resistor 64 is VS, then VN≈VB≈VS.

As will be appreciated, the output current IL is the sum of the current I1 of drain 40 of MOSFET 36 and current I2 of drain 48 of MOSFET 44. That is, IL=I1+I2. As noted above, the multiplier of the MOSFETS, and thus the current at their drains, can be affected by the length and width of the MOSFETS. By way of non-limiting example, if the lengths L1 and L2 of MOSFETS 36 and 44 are about the same, then the drain currents of the MOSFETS can be substantially related by their widths. That is, I2≈I1·(W2/W1) in this non-limiting example.

In this non-limiting example, the output current IL≈(I+W2/W1)·I1 since IL=I2+I1 and I2=I1·[(W2/L2)/(W1/L1)]. Also, I1≈(RB/RS)·IB. Therefore IL≈(RB/RS)·(1+W2/W1)·IB. The ratios (RB/RS) and/or (W2/W1) can be used, in this example, to determine the current multiplication from IB to IL. In this example, the ratios are chosen to be large to make the value of IB small and thus minimize power consumption. For example, if IB=10μA and IL=1 A, then IL/IB=100,000. This can be achieved with W2/W1=100 and RB/RS=1000, in this non-limiting example.

As will be appreciated from the forgoing, a method for providing high current with low dropout includes splitting output current IL into a current I1 that flows through a series connection of MOSFET 36 and resistor 64 to ground and a current I2 that flows through MOSFET 48 to ground. By maintaining the gate-to-source voltages of MOSFET 36 and MOSFET 44 to be about equal, the output impedance at the drain of MOSFET 44 and the current I2 will match the output impedance at the drain of MOSFET 36 and the accuracy of current I1.

It should be noted that, since I2>>I1, that most of the output current IL will flow through MOSFET 44 to ground. That is, most (e.g. 99%) of the output current IL does not flow through a sensing resistor. This has the distinct advantage of reducing drop-out caused by a voltage drop across a sensing resistor for most of the current flowing through the load (e.g. LED) and $I^2R$ power losses by the sensing resistor.

It will therefore be appreciated that, with the example circuit of FIG. 3, an output current IL provided to a VL+ terminal has the two components, I1 and I2. Op-amp 52 is used in a negative feedback configuration such that the voltage across resistor (RB) 62 is replicated across resistor (RS) 64. It should be noted that, while there are small errors associated with the offset voltage of op-amp 52 (i.e. the small voltage differential between the plus input 54 and the minus input 56) and the open loop gain of op-amp 53, these errors are only second-order contributors and can be ignored for many embodiments.

The output current I1 is precisely set by the resistor ratio RB/RS and the input current source IB. That is, I1≈(RB/RS)·IB. Large ratios (>1000) are desirable for certain example embodiments for reasons including power savings and circuit die area reduction.

In this example embodiment, a low voltage compliance of MOSFET 36 is about VS+VDSsat1, where VS is the voltage across the sensing resistor 64 and wherein VDSsat1 is the drain-to-source saturation voltage for MOSFET 36. Vgs1 of MOSFET 36 is replicated as on MOSFET 44 by level shifting (VN≈VS) such the Vgs1≈Vgs2.

It should be noted that, in this example, Vds2−Vds1≈VS, where Vds2 is the drain-to-source voltage of MOSFET 44 and Vds1 is the drain-to-source voltage of MOSFET 36. Typically, this constant voltage difference is small (<100 mV) compared to the total swing of VL+. Therefore, the output impedance of MOSFET 44 follows the high output impedance of MOSFET 36 driven by the output 58 of op-amp 52 configured in negative feedback loop by coupling node 38 to node 56. That is, high output impedance will be present at output node 40 without using a sensing resistor along the main current path (I2) by maintain Vgs2≈Vgs1 as shown and described. As a result, a precision, low-dropout, high-current, high-impedance current source can be implemented.

Figure 4:
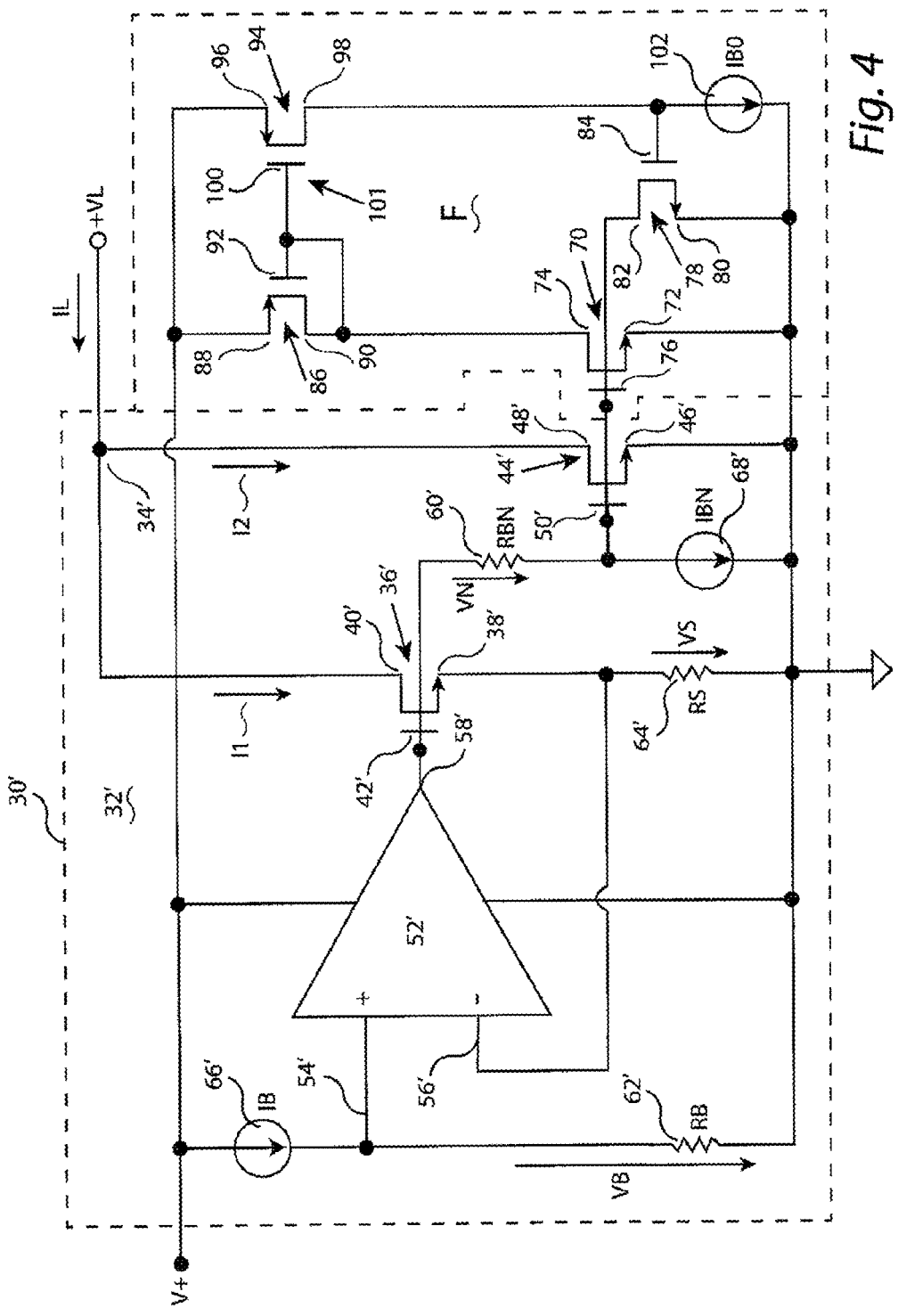
FIG. 4 is a schematic diagram of a second example integrated circuit with precision current source.

In FIG. 4, a second embodiment for an integrated circuit 30', set forth by way of example and not limitation, including a current source circuit including main negative-feedback loop circuitry 32' and current-limiting negative-feedback circuitry F, where like reference numerals refer to like components with respect to the first embodiment of FIG. 3. In this non-limiting example, integrated circuit 30' provides a precision output or load current IL at a voltage VL+ at an output node 34' that is current limited at low VL levels. The output node 34' can therefore provide high, precision, magnitude-limited current levels to loads such as light emitting diodes (LEDs). It should also be noted that the load voltage VL+ can be higher than the power source voltage V+. As discussed previously with regards to the first embodiment of FIG. 3, the integrated circuit 30' of this non-limiting example may be formed on semiconductor chip using MOSFET-related technologies and packaged for use with other electronic components.

In this non-limiting example, integrated circuit 30' includes a metal-oxide semiconductor field-effect transistor (MOSFET) 36' formed on semiconductor substrate 32' having a source 38', a drain 40' and a gate 42'. MOSFET 36', in this example, is characterized by a multiplier ×M1. Integrated circuit 30' also includes a MOSFET 44' formed on semiconductor substrate 32' having a source 46', a drain 48' and a gate 50' and is characterized by a multiplier ×M2. In this example, the ratio of ×M2 to ×M1 is preferably greater than one, e.g. ×M2/×M1>1.

An operational amplifier (op-amp) 52', in this example, is also formed on semiconductor substrate 32'. Op-amp 52' has a plus input 54', a minus input 56' and an output 58'. The output 58' of op-amp 52' is connected to gate 42' of MOSFET 36'. A resistor (RBN) 60' couples the gate 42' of MOSFET 36' to the gate 50' of MOSFET 44'.

Integrated circuit 30' further includes a resistor (RB) 62' coupling the plus input 54' of op-amp 52' to ground and a resistor (RS) 64' coupling source 38' to ground. It should be noted that resistors, such as resistors 60', 62' and 54', formed on semiconductor substrates, such as semiconductor substrate 32', can be quite precise and are easily matched, if desired.

In an embodiment, source 38' is coupled to the minus input 56' of the op-amp 52' to provide negative feedback. This has several desirable effects, including making the voltages between the positive input 54' and the negative input 56' of op-amp 52' substantially equal, except for a small offset error. For example, a 0.5 mV offset between plus input 54' and minus input 56' can result in a small error in the order of 1%. It will be further appreciated by those of skill in the art that op-amp 52', when configured as shown and described, has high output 58' impedance. Furthermore, the negative feedback configured op-amp 52' provides for a desired biasing of MOSFETs 36' and 44'.

Integrated circuit 30' also includes a current source (IB) 66' coupling a voltage source V+ to the plus input 54' of op-amp 52' and a current source (IBN) 68' coupling gate 50' of MOSFET 44' to ground. Current source 66' sets the voltage drop across bias resistor 62' and current source 68' sets the voltage drop VN across the NMOS bias resistor 60'. The design and manufacture of IC current sources, such as current sources 66' and 68', are well known to those of skill in the art.

In this example embodiment, the circuit is designed such that the gate-to-source voltages of MOSFETS 36' and 44' are about the same. That is, if MOSFET 36' has a gate-to-source voltage of Vgs1 and if MOSFET 44 has a gate-to-source voltage of Vgs2, then Vgs1 is approximately equal to Vgs2. This can be accomplished using the negative feed-back op-amp 52' and current sources 66' and 68' to maintain the voltage drops across resistors 60', 62' and 64' to be about equal. That is, if the voltage drop across resistor 60' is VN, the voltage drop across resistor 62' is VB, and the voltage drop across resistor 64' is VS, then VN≈VB≈VS.

Current-limiting feedback circuitry includes a third MOSFET 70 having an source 72, a drain 74 and a gate 76, a fourth MOSFET 78 having a source 80, a drain 82 and a gate 84, a fifth MOSFET 86 having a source 88, a drain 90 and a gate 92, and a sixth MOSFET 94 having a source 96, a drain 98 and a gate 100, and a current source (IB0) 102. MOSFETS 70, 78 and 86 are, in this non-limiting example NMOS transistors, while MOSFETS 86 and 94 are PMOS transistors coupled together as a current mirror 101.

In this non-limiting embodiment, the MOSFETS are sized by, for example, the number of "fingers" per device. As used herein, a "finger" is a unit length and width of a MOSFET element, where the size of the MOSFET is defined by its number of fingers (i.e. one or more fingers per MOSFET). In this example, MOSFET 36' is characterized by a multiplier ×M1, MOSFET 44' is characterized by a multiplier ×M2, MOSFET 70 is characterized by a multiplier ×1/Mn, and current mirror 101 is characterized by a multiplier ×1/Mp.

The current-limiting feedback circuitry F is designed to limit the current IL through MOSFET 44' in the event that the voltage VL drops below a predetermined level (e.g. 1 volt, 0.7 volts, etc.). In such an event, the current IL would increase substantially, e.g. about 50%, in the absence of the circuitry F. With the circuitry F, the peak output current IL is limited to a much smaller increase, e.g. by approximately 5%. This represents an approximately order of magnitude of improvement in the current-limiting capability of the circuit.

The improved current-limiting capability of the integrated circuit 30' can be explained as follows in this non-limiting example. The $V_{GS}$ (gate-source voltage) of MOSFET 36' will increase at low output voltage VL (e.g. <1V) since the feedback loop of the circuit keeps the current I1 constant. The high-current output MOSFET 44' is driven with the same $V_{GS}$ voltage as 36', due to the voltage shift VN (VN=VB). However, MOSFETS 36' and 44' have different $V_{DG}$ (drain-gate voltages). The difference is due the voltage shift VN:$V_{DG}(44')=V_{DG}(36')+VN$. Thus, at lower output voltage, MOSFETS 36' and 44' will behave significantly different due to their different $V_{DG}$ voltages, while $V_{GS}$ voltages are equal. As a result, the output current 12 increases significantly.

Circuitry F addresses the aforementioned circuit operation by providing an additional negative feedback path which includes MOSFETS 36', 44', 70 and 78 and current source (IBO) 102. The aforementioned negative feedback path or "loop" functions as a current regulator, such that the output current increases and reaches the value set by current source (IBO) 102. Below that level the loop is "off", i.e. the circuit operates much as in the first embodiment of FIG. 3. A large ratio between MOSFET 44' and 70 is preferred to maintain the current drawn from the power supply rail (+V) at a low level. The ratio between current sources (IB) 66' and (IBO) 102 is important to this non-limiting example. The size ratios of MOSFETS 44':70 and 86:94 are preferably chosen, in this non-limiting example such that $[(W/L)_{44'}/(W/L)_{70}] \cdot [(W/L)_{86}/(W/L)_{94}] = (1+\epsilon) \cdot I2/IBO$. By way of non-limiting examples: $[(W/L)_{44'}/(W/L)_{70}]$ can be 2;000; $[(W/L)_{86}/(W/L)_{94}]$ can be 25; and I2/IBO can be 45,000. Due to device match variability, a value around 10% is considered to be desirable for $\epsilon$.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. An integrated circuit with precision current source comprising:
    a first metal-oxide semiconductor field-effect transistor (MOSFET) formed on a semiconductor substrate and having a first source, a first drain, and a first gate, wherein the first MOSFET is characterized by a first multiplier (×M1);
    a second MOSFET formed on the semiconductor substrate and having a second source, a second drain, and a second gate, wherein the second MOSFET is characterized by a second multiplier (×M2), and wherein a ratio of ×M2 to ×M1 is greater than one;
    an operational amplifier (op-amp) formed on the semiconductor substrate having a plus input, a minus input and an output, wherein the output of the op-amp is coupled to the first gate;
    a first resistor coupling the first gate to the second gate;
    a first current source coupling the plus input of the op-amp to a positive voltage supply;
    a second current source coupling the gate of the second MOSFET to ground; and
    a negative feedback circuit coupled to the second gate to limit an output current flowing through the second MOSFET.

2. An integrated circuit with precision current source as recited in claim 1 wherein the negative feedback circuit further comprises a third MOSFET formed on the semiconductor substrate and having a third source, a third drain, and a third gate, wherein the third MOSFET is characterized by a third multiplier (a1/Mn).

3. An integrated circuit with precision current source as recited in claim 2 wherein the second gate is coupled to the third gate.

4. An integrated circuit with precision current source as recited in claim 3 wherein the negative feedback circuit further comprises a fourth MOSFET formed on the semiconductor substrate and having a fourth source, a fourth drain, and a fourth gate.

5. An integrated circuit with precision current source as recited in claim 4 wherein the fourth drain is coupled to the second gate and third gate.

6. An integrated circuit with precision current source as recited in claim 5 wherein the negative feedback circuit further comprises a third current source coupling the fourth gate to ground.

7. An integrated circuit with precision current source as recited in claim 6 further comprising a fifth MOSFET having a fifth source, a fifth drain and a fifth gate, wherein the fifth drain is coupled to the fifth gate, the fifth source is coupled to the positive voltage supply, and the fifth drain is coupled to the third drain.

8. An integrated circuit with precision current source as recited in claim 7 further comprising a sixth MOSFET having a sixth source, a sixth drain and a sixth gate, wherein the sixth source is coupled to the positive voltage supply and the six drain is coupled to the fourth gate and the third current source.

9. An integrated circuit with precision current source as recited in claim 8 wherein the fifth gate is coupled to the sixth gate, whereby the fifth MOSFET and the sixth MOSFET comprise a current mirror.

10. An integrated circuit with precision current source as recited in claim 9 wherein the first MOSFET, the second MOSFET, the third MOSFET and the fourth MOSFET are NMOS transistors.

11. An integrated circuit with precision current source as recited in claim 10 wherein the fifth MOSFET and the sixth MOSFET are PMOS transistors.

12. An integrated circuit with precision current source comprising:
- a first metal-oxide semiconductor field-effect transistor (MOSFET) formed on a semiconductor substrate and having a first source, a first drain, and a first gate, wherein the first MOSFET is characterized by a first multiplier (×M1);
- a second MOSFET formed on the semiconductor substrate and having a second source, a second drain, and a second gate, wherein the second MOSFET is characterized by a second multiplier (×M2), and wherein a ratio of ×M2 to ×M1 is greater than one;
- an operational amplifier (op-amp) formed on the semiconductor substrate having a plus input, a minus input and an output, wherein the output of the op-amp is coupled to the first gate;
- first current source coupled between a voltage source and the plus input of the op-amp;
- second current source coupling the second gate of the second MOSFET to ground; and
- a first resistor coupling the first gate to the second gate.

13. An integrated circuit with precision current source as recited in claim 12 wherein the first MOSFET has a first width (W1) and a first length (L1), and wherein the second MOSFET has a second width (W2) and a second length (L2).

14. An integrated circuit with precision current source as recited in claim 13 wherein L1 is approximately equal to L2.

15. An integrated circuit with precision current source as recited in claim 14 wherein W2 is greater than W1.

16. An integrated circuit with precision current source as recited in claim 15 wherein the first MOSFET and the second MOSFET are both n-channel metal-oxide semiconductor (NMOS) transistors and wherein the first drain and the second drain are electrically connected to an output node and the second source is electrically connected to ground.

17. An integrated circuit with precision current source as recited in claim 16 further comprising a second resistor coupling the plus input to ground and a third resistor coupling the first source to ground.

18. An integrated circuit with precision current source as recited in claim 17 wherein the first source is coupled to the minus input.

19. An integrated circuit with precision current source as recited in claim 18 wherein first MOSFET has a first gate-to-source voltage (Vgs1) and the second MOSFET has a second gate-to-source voltage (Vgs2), where Vgs1 is approximately equal to Vgs2.

20. An integrated circuit with precision current source as recited in claim 19 wherein voltage drops across the first resistor, the second resistor, and the third resistor are substantially equal.

* * * * *